United States Patent
Hedler et al.

(10) Patent No.: US 6,953,708 B2
(45) Date of Patent: Oct. 11, 2005

(54) METHOD OF PRODUCING A SEMICONDUCTOR COMPONENT HAVING A COMPLIANT BUFFER LAYER

(75) Inventors: Harry Hedler, Germering (DE); Thorsten Meyer, Dresden (DE); Barbara Vasquez, Orinda, CA (US)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 10/642,063

(22) Filed: Aug. 15, 2003

(65) Prior Publication Data

US 2004/0113270 A1 Jun. 17, 2004

(30) Foreign Application Priority Data

Aug. 29, 2002 (DE) .......................... 102 39 866

(51) Int. Cl.$^7$ ................................. H01L 21/48
(52) U.S. Cl. ........................ 438/110; 438/126
(58) Field of Search ................. 438/106, 110, 438/125–127; 257/678, 687, 701–703, 729, 730, 787, 788

(56) References Cited

U.S. PATENT DOCUMENTS

| | | | |
|---|---|---|---|
| 5,172,215 A | | 12/1992 | Kobayashi et al. |
| 5,554,887 A | * | 9/1996 | Sawai et al. ............... 257/737 |
| 5,710,062 A | * | 1/1998 | Sawai et al. ............... 438/127 |
| 5,959,353 A | | 9/1999 | Tomita |
| 6,291,259 B1 | * | 9/2001 | Chun ........................ 438/106 |
| 6,407,448 B2 | * | 6/2002 | Chun ........................ 257/678 |
| 6,709,898 B1 | * | 3/2004 | Ma et al. .................... 438/122 |
| 2004/0130012 A1 | * | 7/2004 | Hedler ....................... 257/678 |

FOREIGN PATENT DOCUMENTS

| | | |
|---|---|---|
| EP | 0 701 278 B1 | 7/2002 |
| GB | 2 227 122 A | 7/1990 |
| JP | 09321168 | 12/1997 |
| JP | 20011230348 A | 8/2001 |

OTHER PUBLICATIONS

Austrian Patent Office Service and Information Sector, Singapore Search Report, dated May 14, 2004, 7 pages.

* cited by examiner

*Primary Examiner*—Alonzo Chambliss
(74) *Attorney, Agent, or Firm*—Fish & Richardson P.C.

(57) ABSTRACT

A method for producing a semiconductor component with the following steps. A semiconductor chip is provided having electrical contacts in a contact making region. A housing including a rear plate and a side area is provided and surrounds the semiconductor chip. A first compliant buffer layer is applied on a rear plate. The semiconductor chip is applied to the first compliant buffer layer, and a second compliant buffer layer is applied to and around the semiconductor chip except in the contact making region. A contact passage plate is provided with an opening over the contact areas and the contact passage plate is fixed to the second compliant buffer layer.

26 Claims, 11 Drawing Sheets

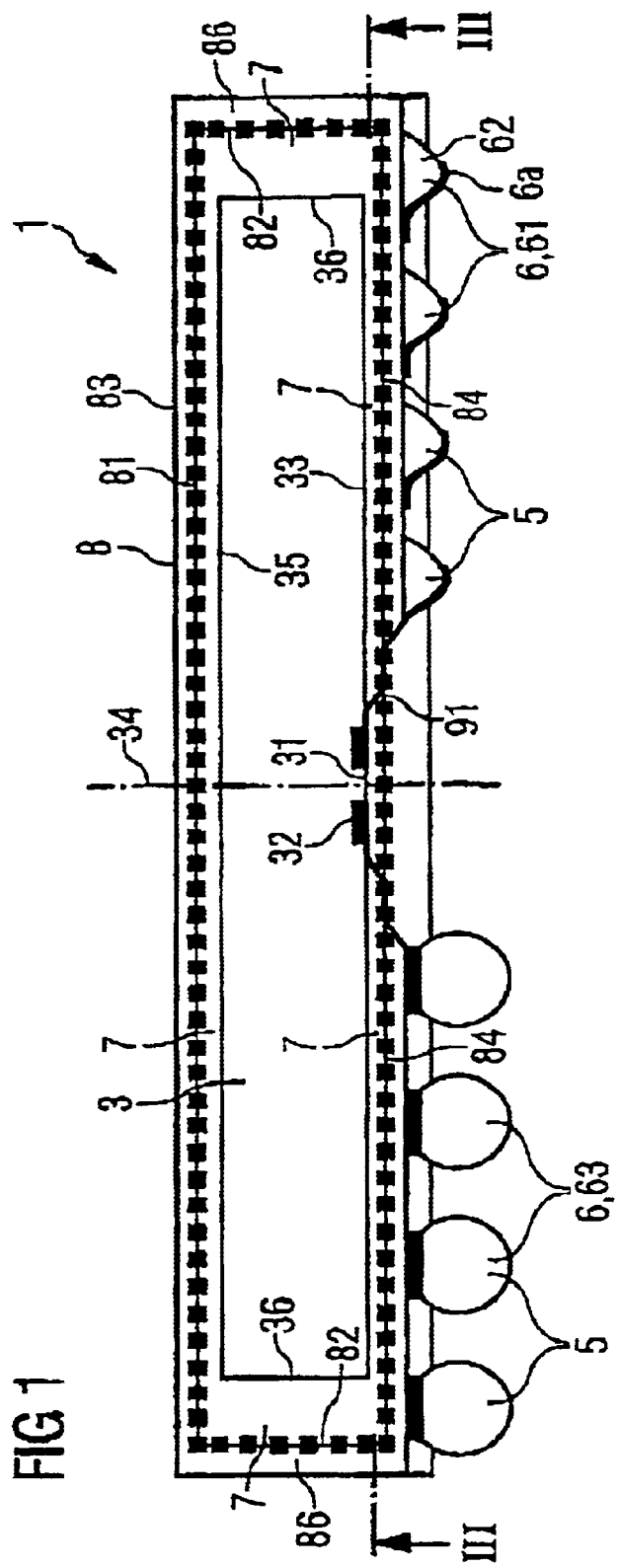

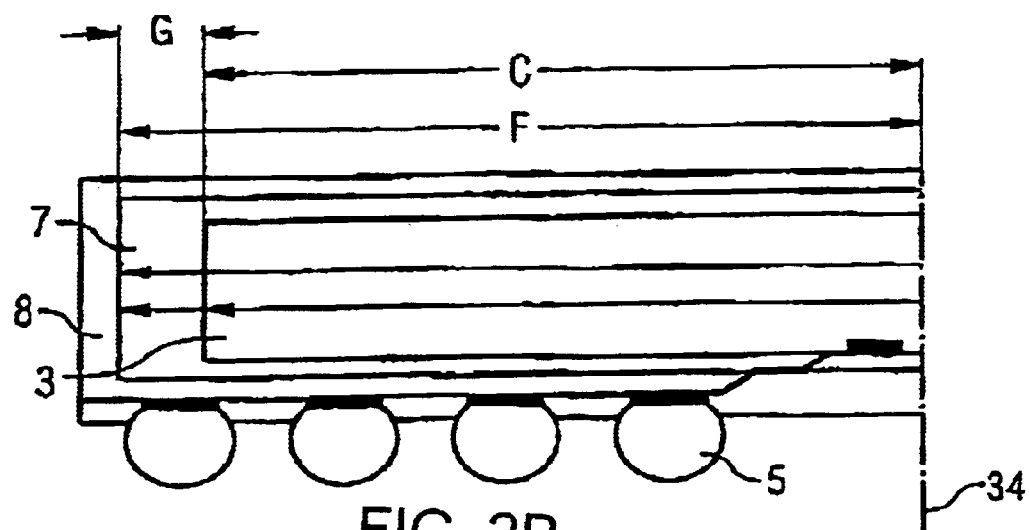
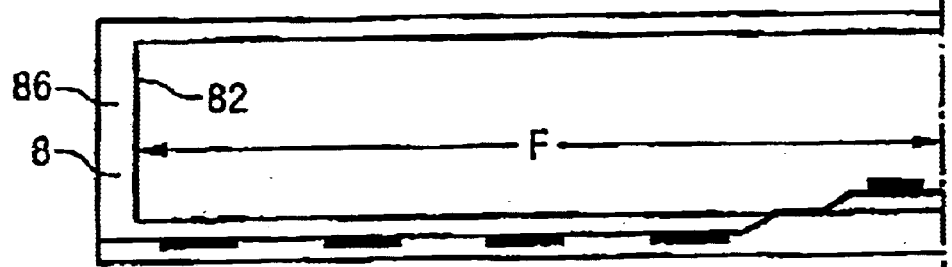
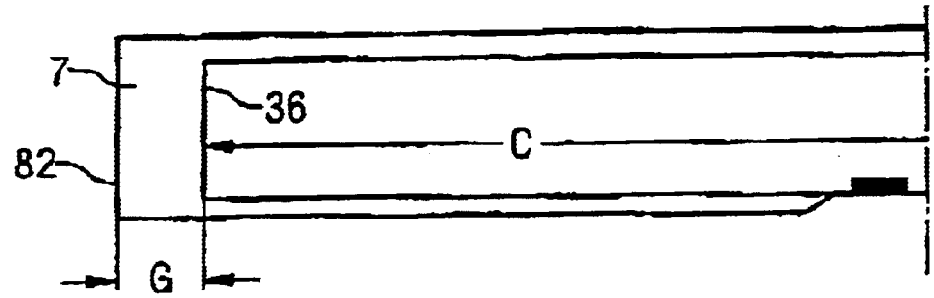

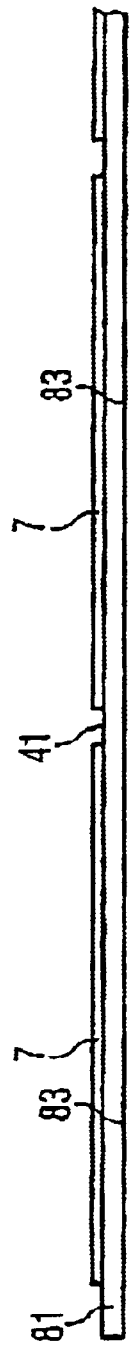
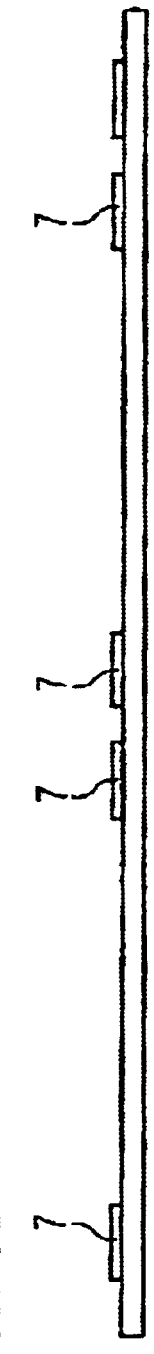
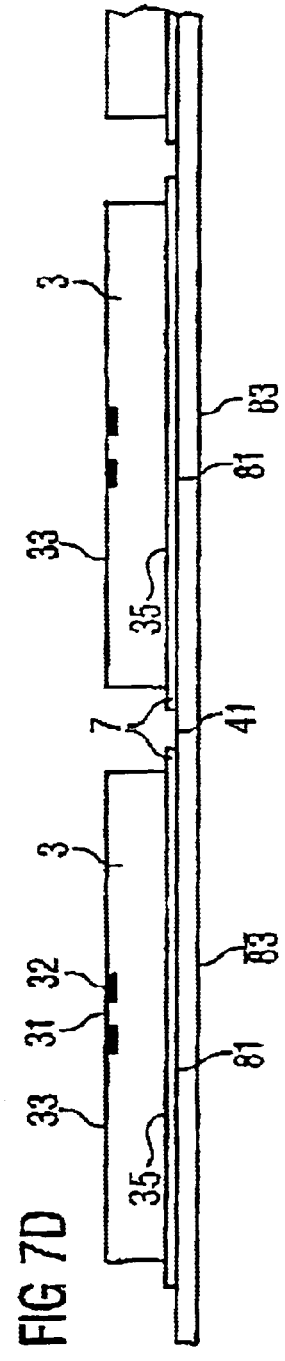

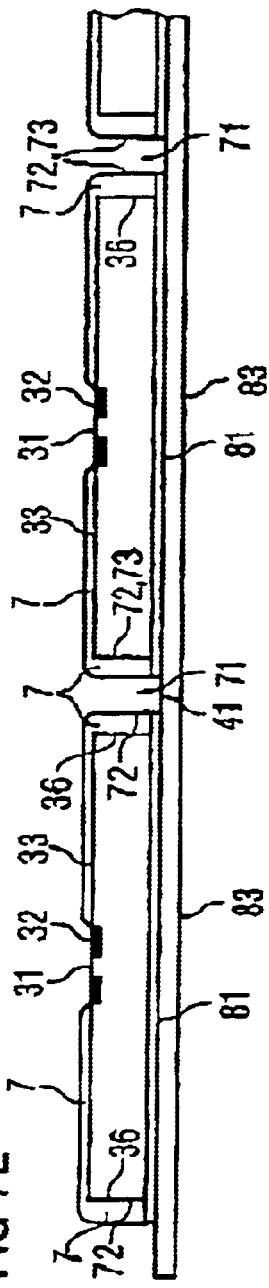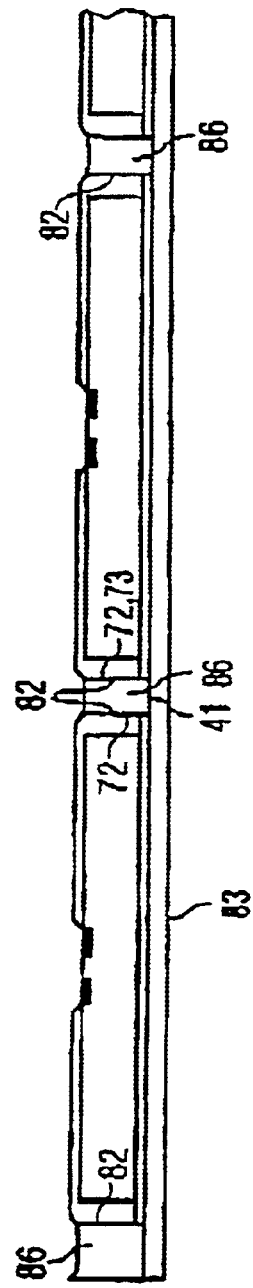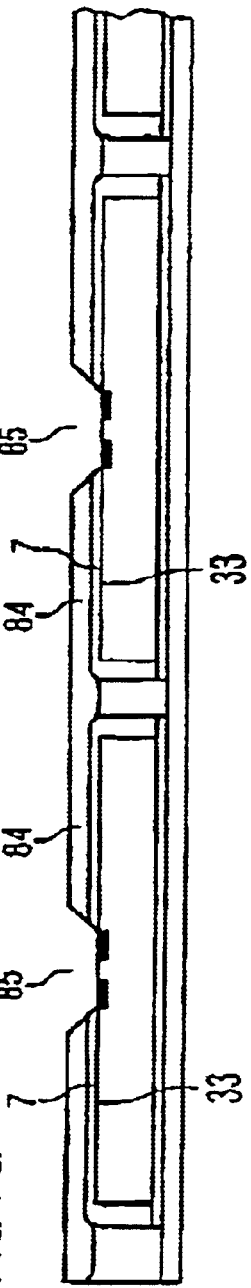

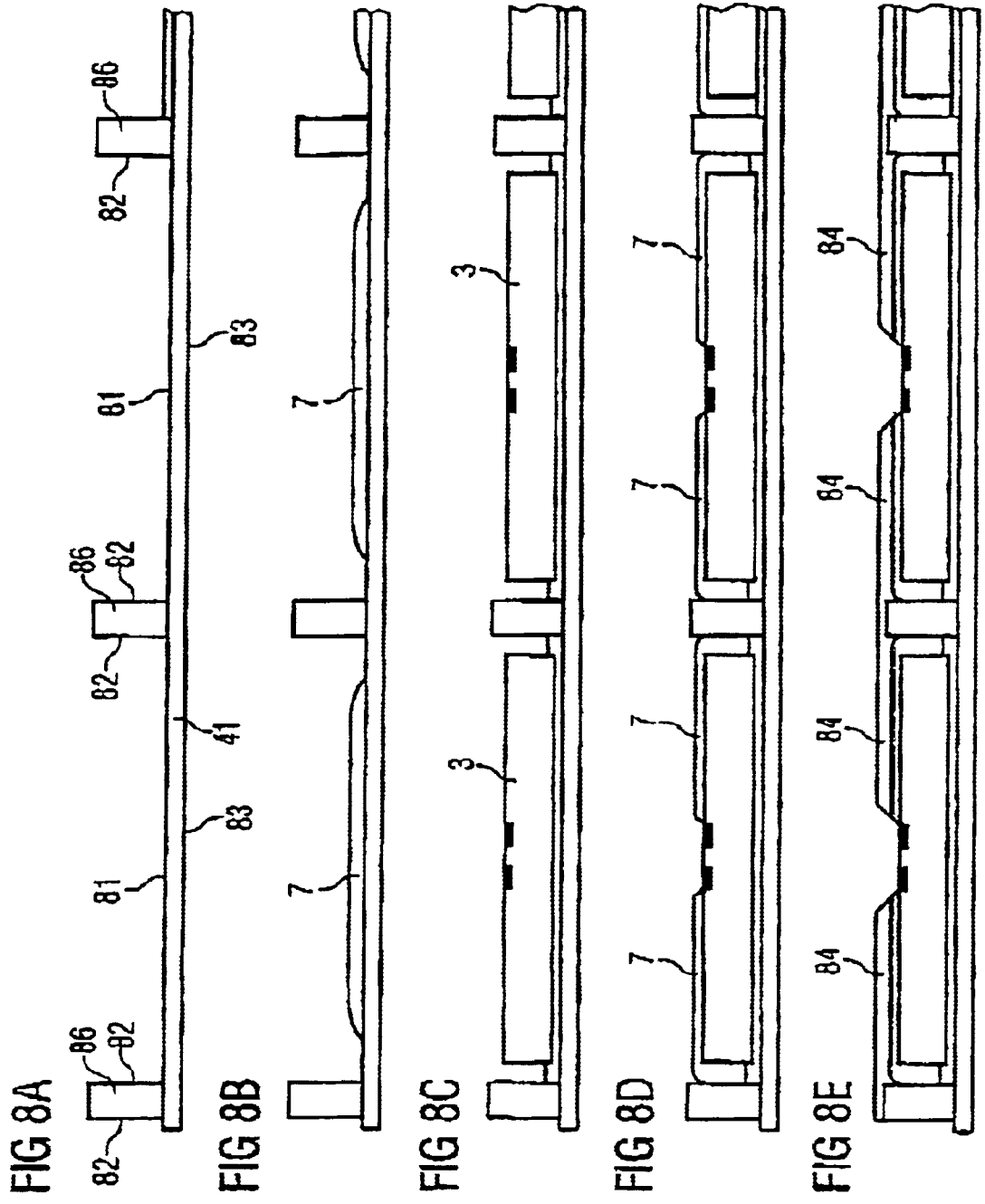

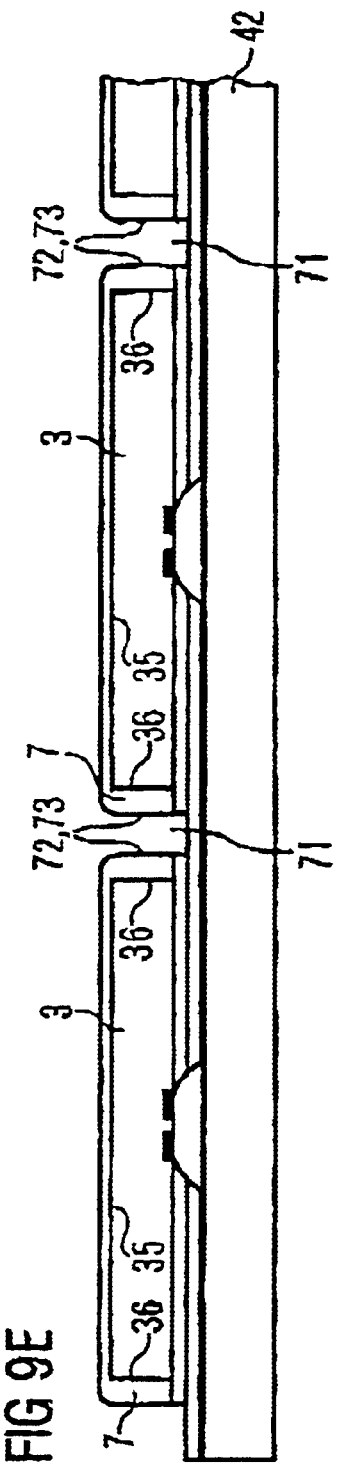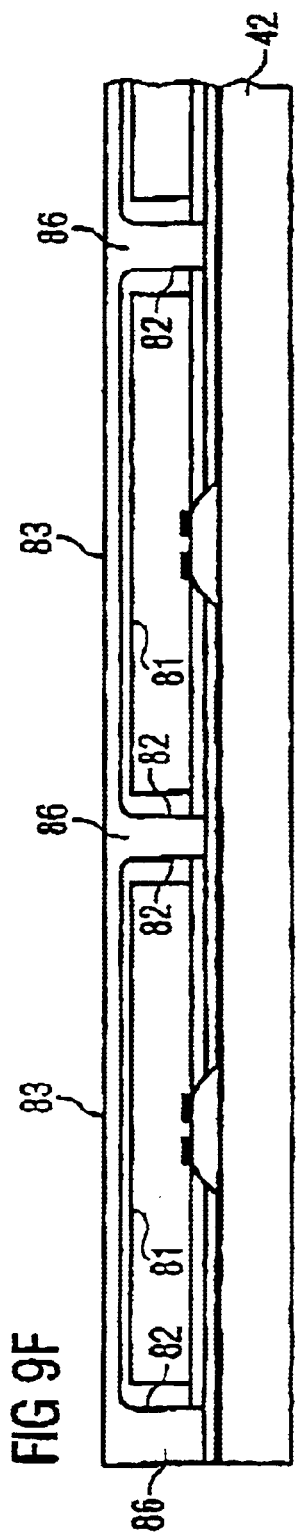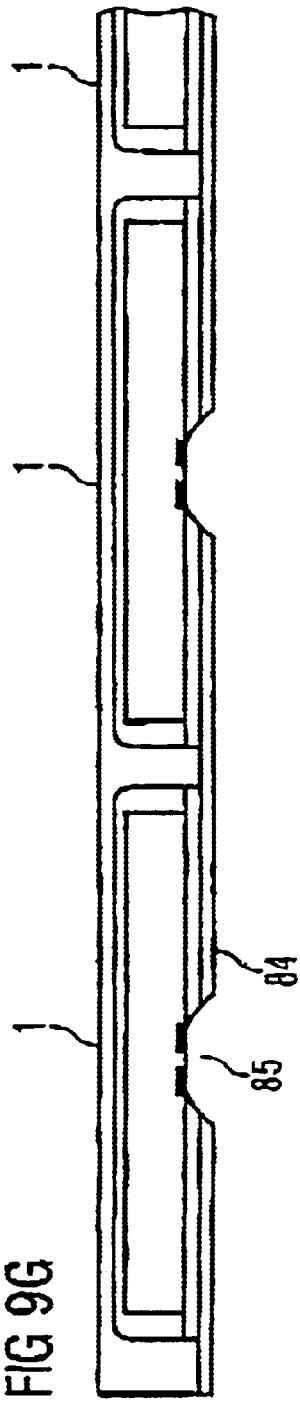

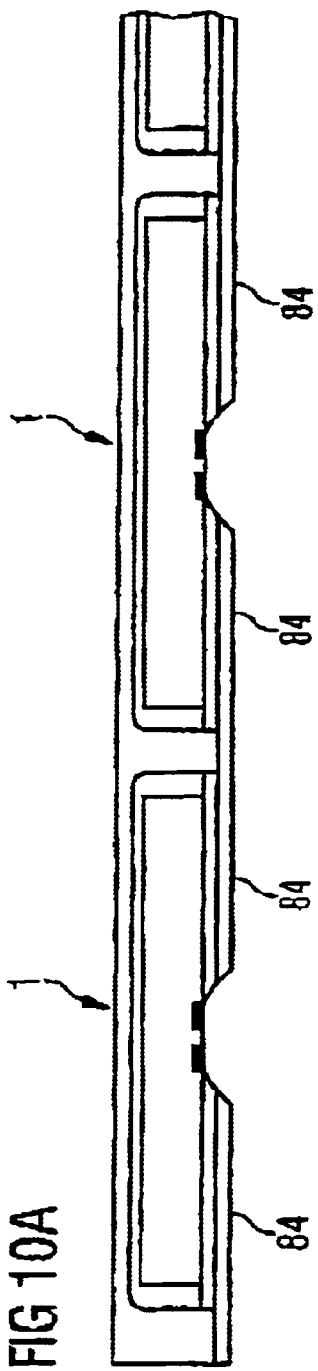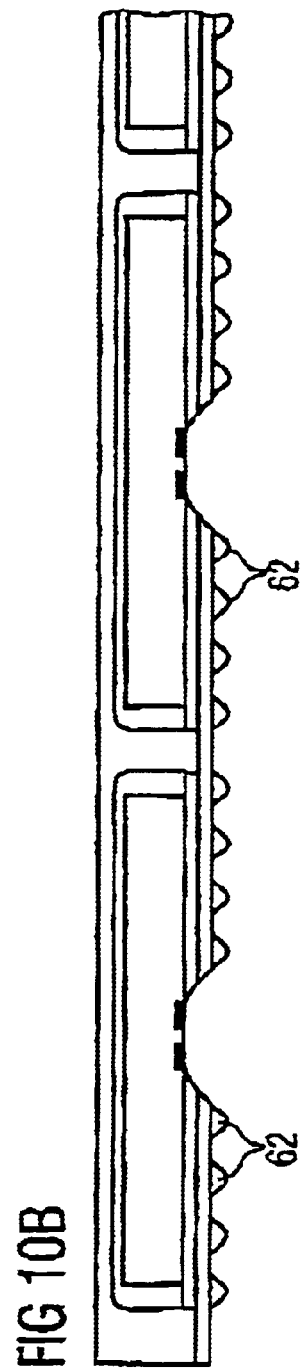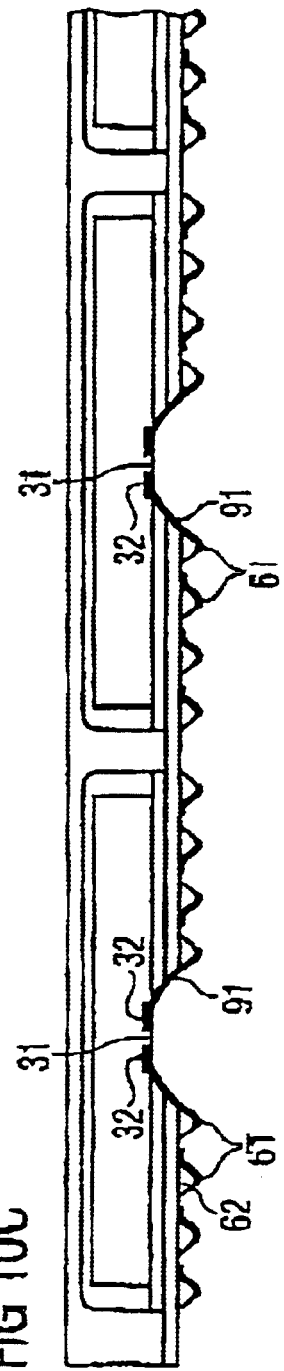

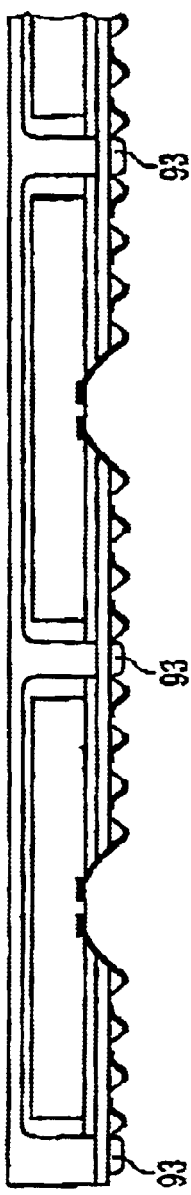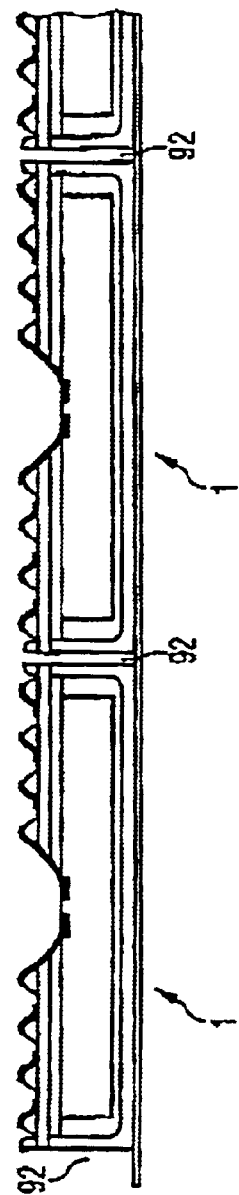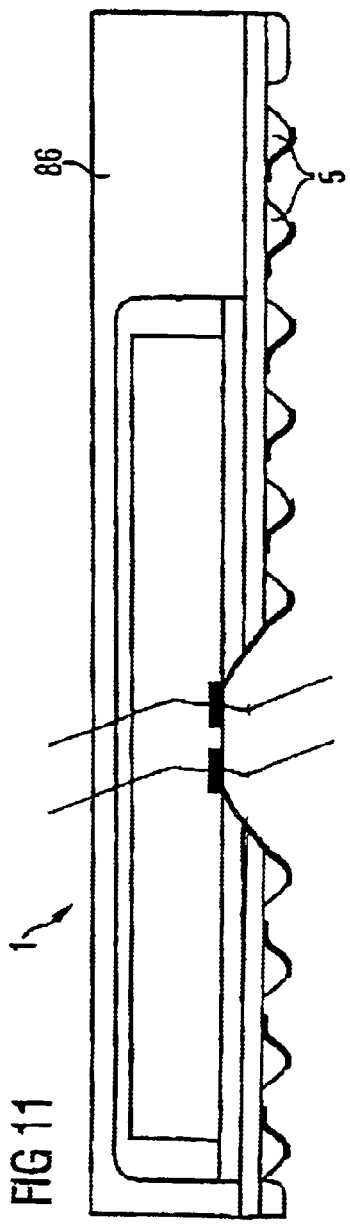

METHOD OF PRODUCING A SEMICONDUCTOR COMPONENT HAVING A COMPLIANT BUFFER LAYER

RELATED APPLICATIONS

This application claims priority from German Application Serial No. 102 39 866.6, filed Aug. 29, 2002, the contents of which are incorporated herein by reference.

TECHNICAL FIELD

The invention relates to methods for producing a semiconductor component and more specifically to a semiconductor component having a compliant buffer layer at least partially surrounding a semiconductor chip.

BACKGROUND

In large scale integrated and greatly miniaturized semiconductor components, the problem that occurs to an intensified extent after said components have been mounted on printed circuits (printed circuit boards) is that in the event of temperature fluctuations, on account of the different thermal expansion coefficients of the materials involved, strong mechanical stresses occur within the component and between the component and the printed circuit board. FIG. 5 shows a customary design of such a miniaturized semiconductor module. The semiconductor component 1 is connected to the printed circuit board 2 by its electrical contacts 5. The semiconductor chip 3 in turn is connected to the interposer 12 by means of electrical contacts 14, the semiconductor chip being bonded to the interposer for the purpose of mechanical stabilization by means of an underfiller 13. The semiconductor chip 3 is furthermore encapsulated with an encapsulation 15. The interposer 12 as carrier is often also completely encapsulated as well.

Owing to temperature fluctuations or variations, mechanical stresses occur in the known component forms on account of the different thermal expansion coefficients of the different materials. FIG. 6 illustrates this in greater detail. The semiconductor chip 3 has a lower thermal expansion coefficient α than the interposer 12, which is produced from a different material. On account of the different expansion of the semiconductor chip and of the interposer, a strong mechanical stress 16 is transmitted via the underfiller 13, which is necessary for mechanical fixing and stabilization, and generated in the interposer 12. In order that a connection fracture of the electrical contacts 14 does not arise here, the thermal expansion coefficient of the interposer must already be adapted to the semiconductor chip. However, printed circuit boards 2 that are usually used have a thermal expansion coefficient that is greatly different from semiconductor chips. Therefore, the interposer 12, which is already under mechanical stress, exerts a strong mechanical stress 17 on the printed circuit board 2 via the electrical contacts 5 strained by said interposer. In the extreme case, this strong mechanical strain can lead to a deformation of the printed circuit board, which, particularly in the case of double-sided populations of printed circuit boards, may lead to the fracture of electrical contacts 5 and thus to the destruction of the electronic apparatus. If the deformation does not immediately lead to fracture in the choice of many instances of strain and strain relief it will then lead to fatigue of the material of the electrical contacts 5, which then again ultimately leads to the fracture thereof and limits the service life. Moreover, the high degree of different expansion, and thus the mechanical strain, of the semiconductor component in itself, that is to say on the one hand between semiconductor chip and interposer, and a semiconductor chip and encapsulation—in which a strain 18 is again induced—on the other hand, leads to fatigue of the electrical contacts 14, as a result of which the electrical contacts within the semiconductor components 1 may also be destroyed.

Direct placement of a semiconductor chip onto a printed circuit board only by means of bumps, in order to prevent mechanical stresses or transmissions thereof from interposed layers, does not achieve the goal either since a stable mechanical connection between the semiconductor chip and the printed circuit board cannot be produced by this means. Moreover, adhesive bonding of a chip by means of bumps with an underfiller, for example in the form of a resist, would here only carry the direct strains from the semiconductor chip to the printed circuit board. This would again result in deformation of the printed circuit board, with the abovementioned difficulties. In particular, in the case of printed circuit boards populated on both sides, it would lead to a destruction of circuits situated on one side of a printed circuit board or of the electrical contacts of said circuits.

In order that electronic circuits with a sufficiently long life can nevertheless be produced, complicated and thus expensive housing constructions are necessary for semiconductor components.

SUMMARY

Therefore, it is an object of the invention to provide a method for producing a semiconductor component, and a semiconductor component in which the abovementioned disadvantages do not occur and in which the very compact design is nevertheless made possible.

According to the invention, it is provided that a compliant buffer layer is applied on a rear plate, which at least forms the rear side area, that the semiconductor chip is thereupon applied to the compliant buffer layer by its rear side and fixed, that a compliant buffer layer is applied to and around the semiconductor chip except for the region of the front side within which the contact areas are arranged, that a contact passage plate with a cutout provided over the contact areas is fixed on the compliant buffer layer on the front side of the semiconductor chip.

The method according to the invention proposes that the semiconductor component be made in such a way that the very construction of the semiconductor component can preclude the arising of strains within the component or with a printed circuit board on which the component is to be installed. As a result of the insertion of the buffer layer, the different thermal expansion coefficients of the different materials are compensated for and strains can no longer occur. This enables adaptation to the thermomechanical properties of printed circuit board material, which enables a permanent, strain-free connection between printed circuit board (for example printed circuit) and semiconductor component. The components have a longer life and the electronic circuits produced therewith can be used over a higher temperature range and can complete more hours of operation.

One refinement of the methods proposes that the side wall be produced in one piece together with the rear plate. Costly individual steps can be obviated as a result.

Preferably, after the method step in which a compliant buffer layer is applied to and around the semiconductor chip at its front side and adjoining sides, a side wall forming the side areas of the housing is formed on the rear plate. Steps that are otherwise necessary for the patterning of the side wall are obviated as a result.

An advantageous refinement of the methods provides for a plurality of semiconductor components to be produced simultaneously, the rear plates of the individual semiconductor components comprising a single mounting plate that is yet to be singulated to form individual rear plates in a later step. This enables the side walls to be produced in a particularly effective and inexpensive manner.

Following that, it is advantageously provided that the boundary area is formed by a side of a compliant buffer layer of an adjacent semiconductor component. Additional auxiliary structures are avoided as a result.

A preferred refinement of the methods provides for the mounting plate to have the spatial extent and form of a wafer. This makes it possible to use existing production apparatuses and standardized sequences, which further reduces the costs of production.

In an advantageous manner, the buffer layer is also produced within the region of the electrical contact areas but only between the individual electrical contact areas on the front side of the semiconductor chip. This reduces a temperature-dictated deformation of the opening relative to the surrounding structure.

The contact passage plate advantageously has material within its cutout but not over the electrical contact areas. This further reduces an undesirable deformation of the opening.

In accordance with a further method, it is provided that a stripping auxiliary layer is applied on a production carrier, that a spacer structure is applied on the stripping auxiliary layer, that a layer which forms a contact passage plate is applied on the stripping auxiliary layer around the spacing structure, that a compliant buffer layer is applied on the layer forming the contact passage plate and around the spacer structure, that the semiconductor chip is fixed by its front side on the compliant buffer layer and on the spacer structure, the contact-making region being in planar contact with the spacer structure, that the semiconductor chip is surrounded with a compliant buffer layer at its side areas and its rear side, that a rear plate, which forms at least the rear side area, is formed around the semiconductor chip and around the compliant buffer layer.

What is proposed in this case, however, in contrast to the first method, is that an auxiliary carrier be used, which enables the spacer structure to be employed, as a result of which the shaping and patterning of the recess around the region of the electrical contacts is configured in a simple and effective manner.

Preferably, after the method step in which a compliant buffer layer is applied around the semiconductor chip, a side wall forming the side areas is formed on the production carrier.

In accordance with an advantageous method step, the side wall is formed on the production carrier by means of a casting process, material being cast into the interspaces between a boundary area and the compliant buffer layer. This facilitates production and makes the latter inexpensive.

In accordance with a particularly preferred and advantageous method step, it is provided that a plurality of semiconductor components are produced simultaneously, the boundary area being formed by a side of a compliant buffer layer of an adjacent semiconductor component on the production carrier. This enables particularly simple and sufficient mass production without having to use additional structures or molds.

It is likewise advantageously provided that the rear plate and the side wall forming the side areas are produced together, in particular in a casting or "molding" process. Work steps are additionally obviated as a result.

Preferably, the semiconductor component is separated from the production carrier after the formation of the rear plate.

Following that, in accordance with a further method step, it is provided that after the separation from the production carrier, an additional layer of a soft material is applied around the region of the electrical contact areas. This enables a softer transition between semiconductor chip and housing.

The stripping auxiliary layer and/or the spacer structure is advantageously chosen such that the latter can be removed by means of UV irradiation or a solution which does not attack the semiconductor component. This ensures the stripping in a particularly simple manner.

Preferably, the spacer structure has an outer form essentially in the shape of a truncated cone or truncated pyramid. This ensures that no instances of contact with layers which are not desired take place.

An advantageous refinement of the method provides for the semiconductor chip to be fixed on the compliant buffer layer by being pressed into the latter and/or curing of the compliant buffer layer. That is particularly inexpensive and can be effected in one work operation with the placement, which makes further adhesives or the like superfluous and obviates them.

Preferably, the buffer layer is produced between the housing and a side area of the semiconductor chip with a diameter G of at least $$G := C \cdot \frac{\alpha_F - \alpha_C}{\alpha_G - \alpha_F}$$

where G is the diameter of the buffer layer between the housing and a side area of the semiconductor chip, C is the length of the solder from the side area to the central point of the semiconductor chip, αC is the thermal expansion coefficient of the semiconductor chip, αG is the thermal expansion coefficient of the buffer layer and αF is the thermal expansion coefficient of the housing.

In accordance with an advantageous refinement of the method, the electrical contacts are formed by bumps fixed to the semiconductor component.

Solder bumps are advantageously chosen as the bumps. They can easily be fixed to the semiconductor component in one work operation.

Likewise in an advantageous manner, silicone bumps with electrical conducting areas led over them in a patterning or printing process for contact-making purposes or electrically conductive bumps essentially composed of silicone ("compliant bumps") are chosen as the bumps.

The material of the buffer layer is preferably chosen such that the thermal expansion coefficient of the buffer layer is greater than the thermal expansion coefficient of such printed circuit board material on which the semiconductor component is to be fixed. This compensates for the corresponding thermal expansion coefficient of the semiconductor chip, as a result of which strains are effectively avoided.

Preferably, the material of the housing, in particular of the rear plate and/or contact passage plate and/or of the side wall, is chosen such that the thermal expansion coefficient of the housing is equal to that of such printed circuit board material on which the semiconductor component is to be fixed. This avoids an undesired strain between housing and printed circuit board.

According to a further refinement, the material of the housing is chosen such that the thermal expansion coefficient of the housing is greater than that of the semiconductor chip.

A further advantageous refinement of the invention provides for the material of the buffer layer and of the semiconductor chip to be chosen such that the thermal expansion coefficient thereof together is equal to that of the housing and/or to that of such printed circuit board material on which the semiconductor component is to be fixed.

The invention is explained in more detail below with reference to the drawing, in which:

DESCRIPTION OF DRAWINGS

FIG. 1 shows a semiconductor component according to the invention for mounting on a printed circuit board, FIG. 2 shows a detail view of the semiconductor component from FIG. 1, FIGS. 7A, 7B, 7C, 7D, 7E, 7F, and 7G shows a diagrammatic method sequence according to a first production method in steps a to g from top to bottom;

FIGS. 8A, 8B, 8C, 8D, and 8E shows a diagrammatic method sequence according to a variant in the production method in steps a to e from top to bottom;

FIGS. 9A, 9B, 9C, 9D, 9E, 9F, and 9G shows a diagrammatic method sequence according to a second production method in steps a to g from top to bottom;

FIGS. 10A, 10B, 10C, 10D, and 10E shows a diagrammatic method sequence for producing the electrical contacts in steps a to e from top to bottom, and FIG. 11 shows an exemplary semiconductor component produced by the method.

DESCRIPTION OF PREFERRED EMBODIMENTS

Figure 3:
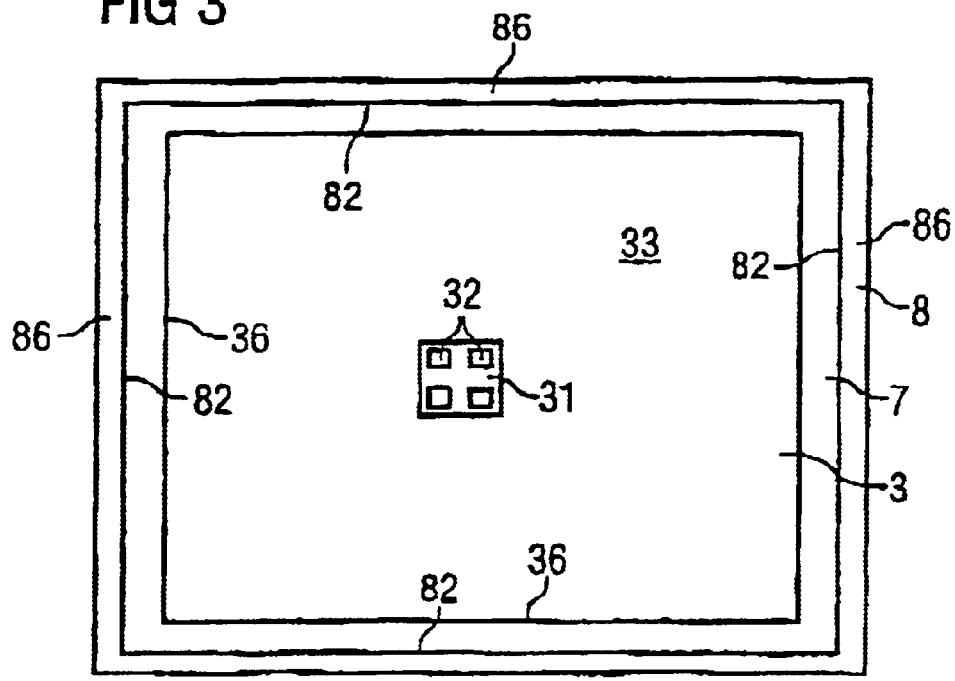
FIG. 3 shows a detail view from FIG. 1 in viewing direction III.

FIG. 1 diagrammatically shows a semiconductor component 1 according to the invention, which is provided for mounting on a printed circuit board. In this case, the semiconductor chip 3 is completely encapsulated by the housing 8 for protection from external effects. Within the housing 8, the semiconductor chip 3 is surrounded with a buffer layer 7 except for the product-making region 31. Within the contact-making region 31, the semiconductor chip 3 is connected via electrical contact areas 32 via line feeds 91 to the electrical contacts 5 in the form of bumps 6 (solder bumps 63), via which the electrical contact is made with the electrode areas provided for this purpose on the printed circuit board surface of the printed circuit board (not illustrated).

To the right of the central axis 34, the semiconductor component is provided with so-called compliant bumps 61, that is to say compliant bumps 6 as electrical contacts 5. In this case, the actual bumps 61 are formed by silicone shapings 62 which, in the example, for contact-making purposes, are coated with a thin, highly flexible metal strip 6a in order to enable the electrical contacts between bumps 6 and electrical contact areas 32.

The semiconductor chip 3 is embedded softly in the elastic buffer layer 7, thus precluding a strain with the housing 8 and resultant deformation of the external dimensions of the semiconductor component 1.

Therefore, the different thermal expansion coefficients a of semiconductor chip and printed circuit board do not lead to strains since the different expansion between printed circuit board and semiconductor chip 3 is cushioned by means of the sufficiently compliant buffer layer 7. Moreover, the different expansion between semiconductor chip 3 and housing 8 no longer loads the inner contacts 32, 91, 5 since, by virtue of the central arrangement of the contacts in a narrow region of the total area of the chip, a temperature-dictated expansion with respect to the housing no longer leads to dislocations. Fatigue of the electrical contacts inside the semiconductor component and also on the outside of the semiconductor component is no longer brought about as a result of this. The service life is significantly increased.

FIG. 2 shows once again in more detailed fashion an exert from FIG. 1 with exerts serving for clarification, the dimensioning of the layer thicknesses being determined according to the according to the relationship $$G := C \cdot \frac{\alpha_F - \alpha_C}{\alpha_G - \alpha_F}$$

where $\alpha C$ is the thermal expansion coefficient of the semiconductor chip, $\alpha G$ is the thermal expansion coefficient of the buffer layer 7, and $\alpha F$ is the thermal expansion coefficient of the housing. F is the distance between the side area and the central axis 34. G represents the minimum value in this case.

FIG. 3 shows a view in viewing direction III from FIG. 1. The contact-making region 31, within which the electrical contact areas 32 are also situated, is significantly smaller than the mounting side area 33 and is situated in the center thereof.

Figure 4:
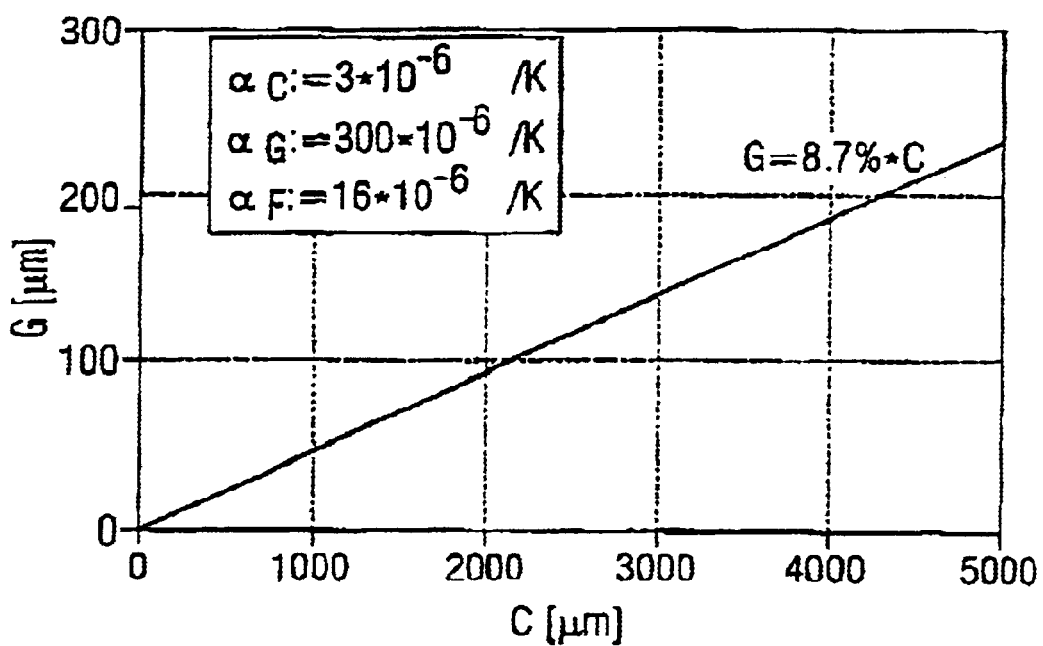
FIG. 4 shows a diagram of the dimensioning of the elements of the semiconductor component.
Figure 5:
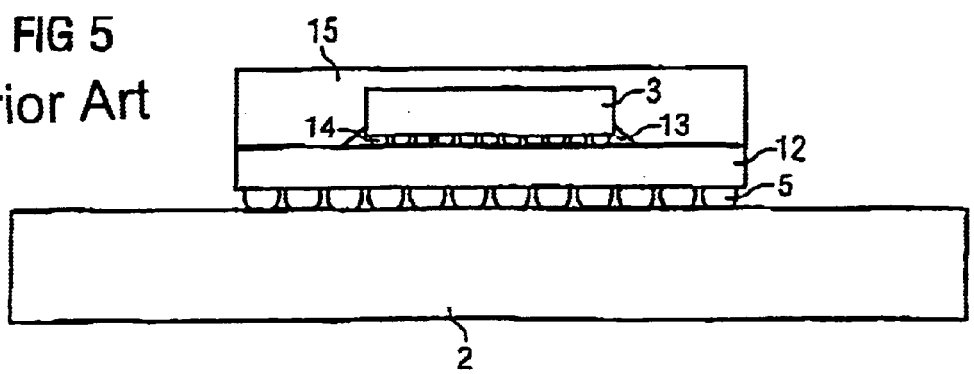
FIG. 5 shows a conventional semiconductor component mounted on a printed circuit board.
Figure 6:
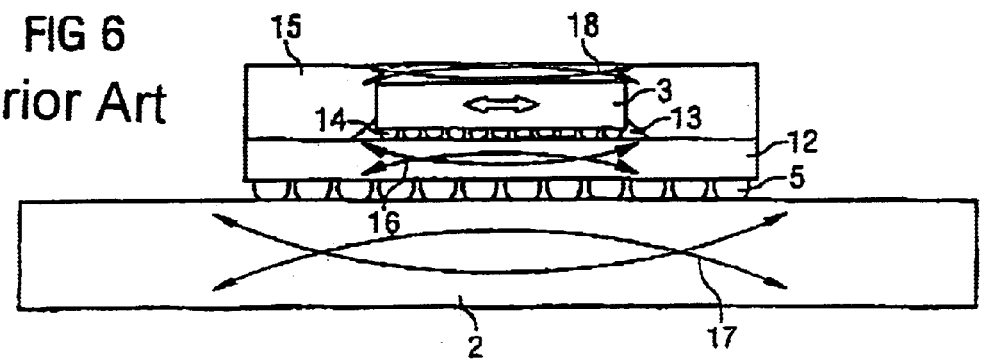
FIG. 6 shows a diagrammatic illustration of strains of a conventional semiconductor component on a printed circuit board.
Figure 9A:
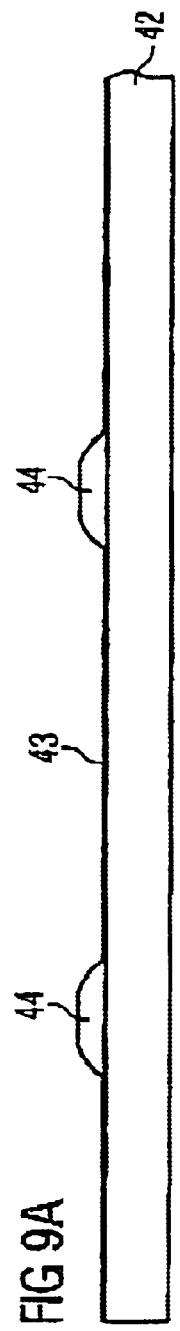
Figure 9B:
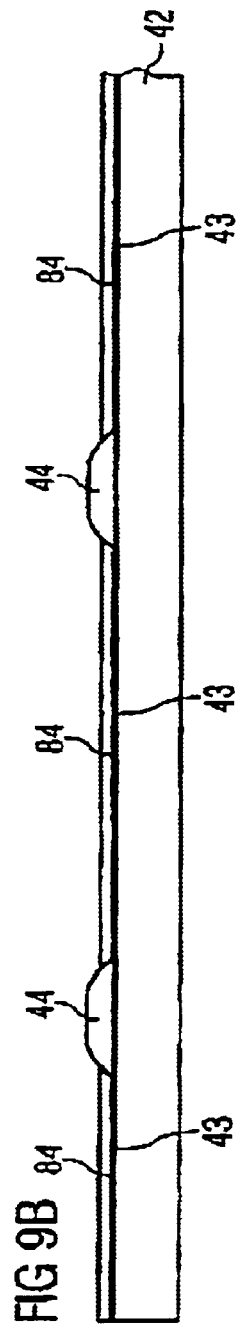
Figure 9C:
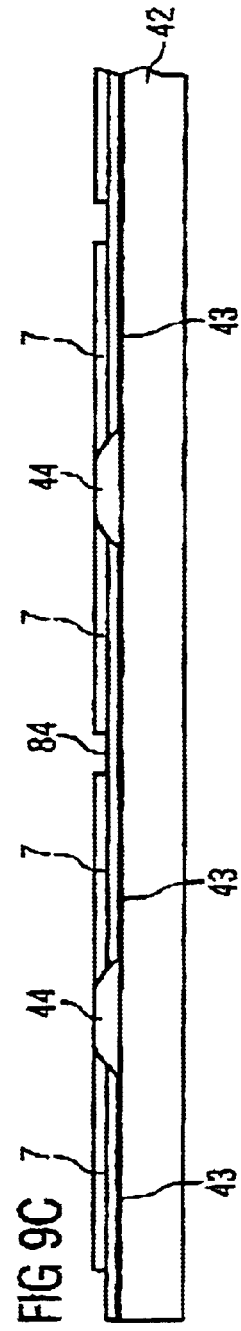
Figure 9D:
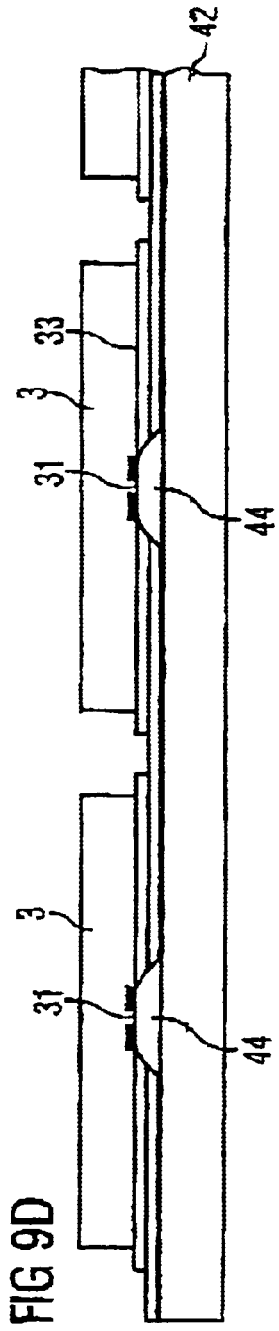

FIG. 4 shows, by way of example, a diagram in which the thickness G of the buffer layer 7 is plotted against half the semiconductor chip diameter C (in the example, central point of the chip on the central axis 34 to a side area 33, 35, 36). The gradient of 8.7% results in this case from the assumed values for the thermal expansion coefficients as:

$\alpha C := 3 \cdot 10-6/K$ $\alpha G := 300 \cdot 10-6/K$ $\alpha F := 16 \cdot 10-6/K$ The values in this case result for example as:

|  | y | x | z |
|---|---|---|---|
| Chip | 5600 | 3000 | 470 |
| Gap | 504 | 270 | 42 | where "Chip" denotes the values of the semiconductor chip 3 in its three spatial dimensions (x, y, z), and "Gap" denotes the thickness G of the buffer layer 7 once again in its three spatial dimensions (x, y, z).

FIGS. 7a to 7g show in exemplary steps how the production method according to the first variant proceeds.

Firstly, a compliant buffer layer 7 is applied on a mounting plate 41, which contains the rear plates 83—which form the rear side areas 81—in as yet nonsingulated form.

The partial illustrations according to FIGS. 7a to 7c here show variants of the patterning of compliant layers, which are intended to illustrate that it is not absolutely necessary here to produce a continuous buffer layer 7.

Partial view 7d shows the semiconductor component 1 after mounting of the semiconductor chips 3, which are fixed on the compliant buffer layer 7 by their rear side 35.

Partial view 7e shows the state after application of the buffer layer at the sides 36 and on the front side 33 of the chip 3, the contact-making region 31, within which the electrical contact areas 32 are located, not being covered in order to enable subsequent contact production with the electrical contacts.

The side walls 86 forming the side areas 82 have already been produced in partial view 7f; in this case, the interspaces 71 (see partial view 7e) between the individual sides 73 of the buffer layers 7 at the sides 36 of the semiconductor chips 3—which in each case mutually form the boundary areas 72—are potted with the material forming the side walls 86.

Partial view 7g shows the state after the fixing of the contact passage plate 84 on the compliant buffer layer 7 on the front side 33 of the semiconductor chip 3. In this case, the contact passage plate 84 has a cutout 85 provided over the contact areas 32 [lacuna] that contact-making can still be effected. In this case, the fixing can be effected by adhesive bonding or immediately directly by the formation of the contact passage plate 84 on the surface of the buffer layer 7.

A slight variation of the production method is shown in exemplary individual steps in FIGS. 8a to 8e. The difference with respect to the method shown in FIGS. 7a to 7g is that, in accordance with partial view 8a, the side walls are produced first on the mounting plate 41. In this case, the side walls 86 may also have been produced at the same time as the mounting plate 41 in a casting process, for example, or, alternatively, be bonded thereon as finished grid.

The further sequence according to FIGS. 8b to 8e is essentially identical to the sequence discussed in FIGS. 7a to 7g, although this time rather than the buffer layers 7 forming the boundaries for the production process for the side walls, the situation is exactly the other way round.

FIGS. 9a to 9g show a production of semiconductor components according to the second variant of the production method.

Firstly, as illustrated in partial view 9a, a stripping auxiliary layer 43 is applied on a production carrier 42. A spacer structure 44 is applied on the stripping auxiliary layer 43. Said spacer structure serves for making a recess in the later housing wall.

As shown in partial view 9b, a layer which forms a contact passage plate 84 is applied on the stripping auxiliary layer 43 around the spacer structure 44.

Partial view 9c shows the state after a compliant buffer layer 7 has been applied on the layer forming the contact passage plates 84 and around the spacer structures 44.

The semiconductor chips 3 have already been fixed on the buffer layer 7 by their front side 3 in partial view 9d; in this case, the contact-making region 31 is in planar contact with the spacer structure 44 in order that this region is not covered later unnecessarily layers to be removed.

Partial view 9e shows how the semiconductor chips 3 have been surrounded again with a compliant buffer layer 7 at their side areas 36 and their rear side 35. In this case, interspaces 71 are left in order to be able to form the side walls 86 in the next step.

These side walls 86 have already been produced in partial view 9f, in a casting process with the rear plate 83 in the example shown.

Partial view 9g shows the state after the production carrier 42 has been stripped away and the as yet nonsingulated components have been freed of the stripping auxiliary layer 43 and the spacer structure 44. The production carrier may be stripped away for example by dissolving the—for example water-soluble—stripping auxiliary layer 43.

FIGS. 10a to 10e show the further contact-making method for the semiconductor components 1, which are still unsingulated up that point according to production variants one and two.

Partial view 10a shows the initial situation of the contact-making submethod with contact passage plates 84 that have been formed.

The formation of compliant bumps is shown below by way of example; it is equally possible here to form other contact connections.

In accordance with partial view 10b, silicone bumps 62 are applied to the contact passage plates 84. These are then coated with metallic contact strips 91 running away from the electrical contact areas 32 (partial view 10c). The metal strips may be fixed or produced by adhesive bonding, sputtering, a patterning process by means of lithography or a plating process or the like.

In partial view 10d, soldering resists 93 have been fixed to the undersides of the semiconductor components 1.

The separation of the individual finished semiconductor components 1 is effected by means of corresponding sawing cuts 92 in partial view 10e.

FIG. 11 shows by way of example a variant of a semiconductor component 1 in which the housing section 86a has been widened for better distribution of the electrical contacts 5. It becomes clear that, however, the spatial dimensions remain the same in this case, however, from buffer layer 7 to semiconductor chip 3.

What is claimed is:

1. A method for producing a semiconductor component, the method comprising
   providing a semiconductor chip having electrical contacts in a contact making region,
   providing a housing that surrounds the semiconductor chip, the housing having a rear plate and a side area,
   applying a first compliant buffer layer on the rear plate,
   applying the semiconductor chip to the first compliant buffer layer,
   applying a second compliant buffer layer to and around the semiconductor chip, except in the contact making region,
   providing a contact passage plate having an opening over the contact making region, and
   fixing the contact passage plate to the second compliant buffer layer.

2. The method of claim 1, further comprising forming a unitary frame structure in which the side area and the rear plate are integral with each other.

3. The method of claim 1, further comprising forming the side area on the rear plate after applying the semiconductor chip to the first compliant buffer layer.

4. The method of claim 3, wherein forming the side area comprises casting material between a boundary area and the first compliant buffer layer.

5. The method of claim 1, further comprising producing a plurality of semiconductor components simultaneously on a mounting plate that includes a plurality of rear plates, and separating the rear plates.

6. The method of claim 5, further comprising selecting the mounting plate to include the spatial extent of a wafer.

7. The method of claim 1, further comprising forming a boundary area from a side of at least one of the first and the second compliant buffer layers of an adjacent semiconductor component.

8. The method of claim 1, further comprising applying a third compliant buffer layer within the contact making region between the electrical contacts.

9. The method of claim 1, further comprising providing material in the opening of the contact passage plate.

10. The method of claim 1, further comprising selecting the opening in the contact passage plate to be larger than the opening in the second compliant buffer layer.

11. The method of claim 1, further comprising selecting a material for the housing from a group consisting of polymerplastic, ceramic, glass, epoxy resin and metal.

12. The method of claim 1, further comprising selecting a spacing between the semiconductor chip and the side wall proportional to a solder thickness.

13. The method of claim 1, further comprising selecting a spacing between the semiconductor chip and the side wall proportional to a ratio of the difference between a thermal expansion coefficient of the housing and a thermal expansion coefficient of the semiconductor chip and the difference between a thermal expansion coefficient of the first and the second buffer layers and a thermal expansion coefficient of the housing.

14. The method of claim 1, further comprising applying conductive bumps to the semiconductor component for electrical contacts.

15. The method of claim 14, further comprising selecting the conductive bumps to include solder.

16. The method of claim 15, further comprising selecting the conductive bumps to include silicone bumps having electrical conduction areas.

17. The method of claim 1, further comprising selecting packaging for the semiconductor component from a group consisting of: a wafer level package, a flip chip, and a chip scale package.

18. The method of claim 1, further comprising selecting a material for the first and the second buffer layers such that a thermal expansion coefficient of the first and the second buffer layers is greater than a thermal expansion of a printed circuit board material.

19. The method of claim 1, further comprising selecting a thermally conductive material for at least one of the first and the second buffer layers.

20. The method of claim 1, further comprising selecting a highly elastic material for at least one of the first and the second buffer layers.

21. The method of claim 1, further comprising choosing a material of the housing such that a thermal expansion coefficient of the housing is equal to that of a printed circuit board material.

22. The method of claim 1, further comprising selecting a material of the housing such that a thermal expansion coefficient of the housing is greater than a thermal expansion coefficient of the semiconductor chip.

23. The method of claim 22, further comprising selecting at least one of the first and the second buffer layers to include a foamed material.

24. The method of claim 1, further comprising selecting a material such that a thermal expansion coefficient of the first and the second buffer layers and a thermal expansion coefficient of the semiconductor chip is equal to a thermal expansion coefficient of the housing and a thermal expansion coefficient the printed circuit board material.

25. The method of claim 1, further comprising selecting at least one of the first and the second buffer layers to include a polymer.

26. A semiconductor component, produced by the method of claim 1.

* * * * *